United States Patent [19]

Goatcher

[11] Patent Number: 4,470,147
[45] Date of Patent: Sep. 4, 1984

[54] RADIO RECEIVER WITH QUADRATURE DEMODULATION AND DIGITAL PROCESSING

[75] Inventor: John K. Goatcher, Harlow, England

[73] Assignee: International Standard Electric Corporation, New York, N.Y.

[21] Appl. No.: 415,968

[22] Filed: Sep. 8, 1982

[30] Foreign Application Priority Data

Sep. 15, 1981 [GB] United Kingdom ................. 8127797

[51] Int. Cl.$^3$ .......................... H03D 3/00; H03D 5/00
[52] U.S. Cl. ......................................... 375/77; 329/1; 329/50; 328/109
[58] Field of Search ....................... 375/14, 15, 38, 39, 375/50, 51, 77, 102; 329/1, 50, 122, 126, 135, 147; 328/109, 135, 140, 151

[56] References Cited

U.S. PATENT DOCUMENTS

| | | |
|---|---|---|
| 3,426,281 | 2/1969 | Klein ....................................... 375/15 |
| 3,646,448 | 2/1972 | Harmon, Jr. et al. ................. 375/39 |
| 3,669,511 | 6/1972 | Motley et al. ......................... 375/15 |
| 3,787,775 | 1/1974 | Lanning .................................. 375/50 |
| 4,004,226 | 1/1977 | Qureshi et al. ......................... 375/15 |
| 4,090,145 | 5/1978 | Webb ..................................... 375/77 |

Primary Examiner—Robert L. Griffin
Assistant Examiner—Stephen Chin
Attorney, Agent, or Firm—John T. O'Halloran; Peter R. Ruzek

[57] ABSTRACT

A multi-mode radio receiver divides the radio frequency input into two channels and in each channel mixes it with the carrier wave frequency. A quadrature shift in the mixing carrier wave frequencies enables base band signals to be filtered from the mixer outputs. The analogue quadrature signals are converted to digital form and processed digitally to reproduce the original modulating signal for am, fm or pm transmissions. For ssb modulation the mixing frequency is the side band center frequency instead of carrier frequency.

6 Claims, 6 Drawing Figures

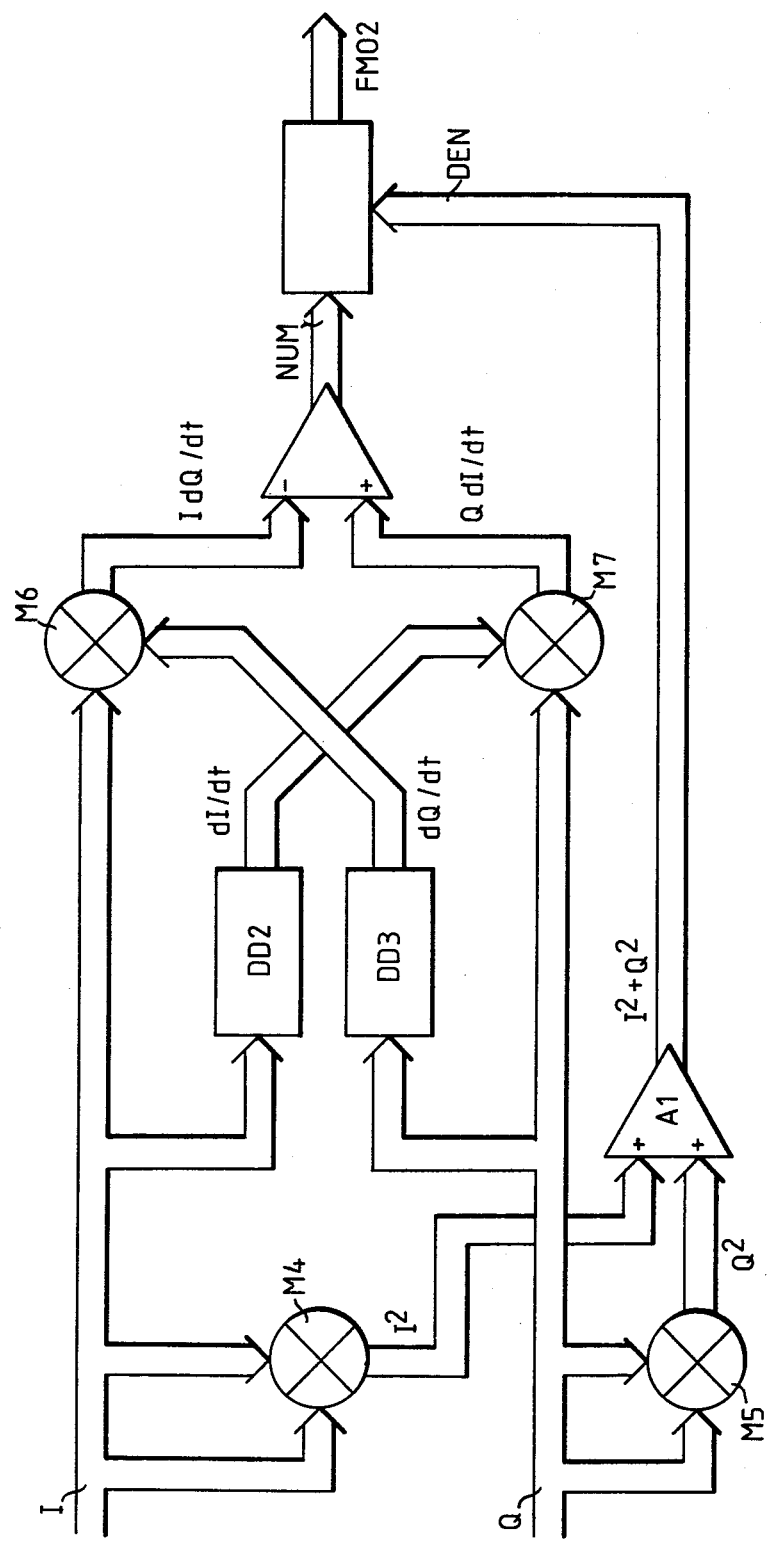

RADIO RECEIVER WITH QUADRATURE DEMODULATION AND DIGITAL PROCESSING

BACKGROUND OF THE INVENTION

This invention relates to radio receivers and is concerned particularly but not exclusively with a multimode receiver capable of receiving and demodulating two or more of the following types of modulation: phase modulation (pm), amplitude modulation (am), frequency modulation (fm) and single side band modulation (ssbm). The invention could also be used in a single mode receiver.

SUMMARY OF THE INVENTION

According to the present invention a radio receiver comprises a first single path in which a received radio signal is mixed with a local oscillator frequency running at the main transmission frequency and then filtered to give a first mixed signal defined as an in-phase signal I, a second signal path in which the received signal is mixed with the local oscillator frequency but with a relative phase shift and then filtered to provide a second mixed signal defined as a quadrature signal Q, an analogue to digital converter stage to digitise the I and Q signals and a digital signal processor arranged to demodulate the digitised I and Q signals.

For pm, am and fm, the main transmission frequency at which the local oscillator runs is the carrier wave frequency but for ssbm the main transmission frequency is at the sideband centre frequency. Preferably, a digital to analogue converter is provided to convert the demodulated digital signals into analogue signals. However, if the receiver operates in a situation where signals are required or can be used in digital form, the digital to analogue conversion may be unnecessary.

Preferably, the digital signal processor includes means to derive amplitude (R) and/or phase ($\theta$) of the modulation signals from the digitised I and Q signals to provide demodulation of amplitude and/or phase modulation. As will be explained below, digitised R and $\theta$ signals can also be used as intermediate values in deriving demodulated fm and ssbm.

In one example, the digital signal processor has means to derive the phase $\theta$ of the modulating signal and to differentiate $\theta$ with respect to time t to derive $d\theta/dt$, constituting demodulation of frequency modulation.

In another example the digital signal processor includes means to derive both R and $\theta$, has means to subtract or add phase at the offset frequency to the phase angle $\theta$ to provide a new phase angle $\phi$ and has means to drive $R \sin \phi$ or $R \cos \phi$ to produce digitised single side band demodulation for upper or lower single side band modulation depending respectively on whether the phase is subtracted or added.

Some or all of the demodulation techniques discussed above may be incorporated into a single receiver to provide a multi-mode receiver. For this, the digital signal processor is provided with means to derive the output of any combination of at least two of:

(a) $\theta$ for phase modulation
(b) R for amplitude modulation
(c) $d\theta/dt$ for frequency modulation
(d) $R \sin \phi$ or $R \cos \phi$ for single side band modulation to provide a radio receiver capable of receiving and demodulating two or more of the four specified forms of modulation. The invention may also be used in a single mode receiver provided with means to drive one+one of the signals a, b, c or d.

Feed-back control circuits from the digital signal processor may be provided whereby R and/or $\theta$ in their digitised form are employed to control respectively amplification within the two channels and/or the relative phase shift in the second channel as compared with the first channel. Alternatively digital correction signals may be calculated from error signals and applied directly to the digitised signals derived from the two channels.

BRIEF DESCRIPTION OF THE DRAWINGS

An embodiment of the invention will now be described with reference to the accompanying drawings in which:

FIGS. 4 and 5 are block diagrams which illustrate the derivation of digital control signals for phase and amplitude controls and
FIG. 6 shows an alternative for part of FIG. 2.

DETAILED DESCRIPTION OF THE PREFERRED EMBODIMENTS

Figure 1:
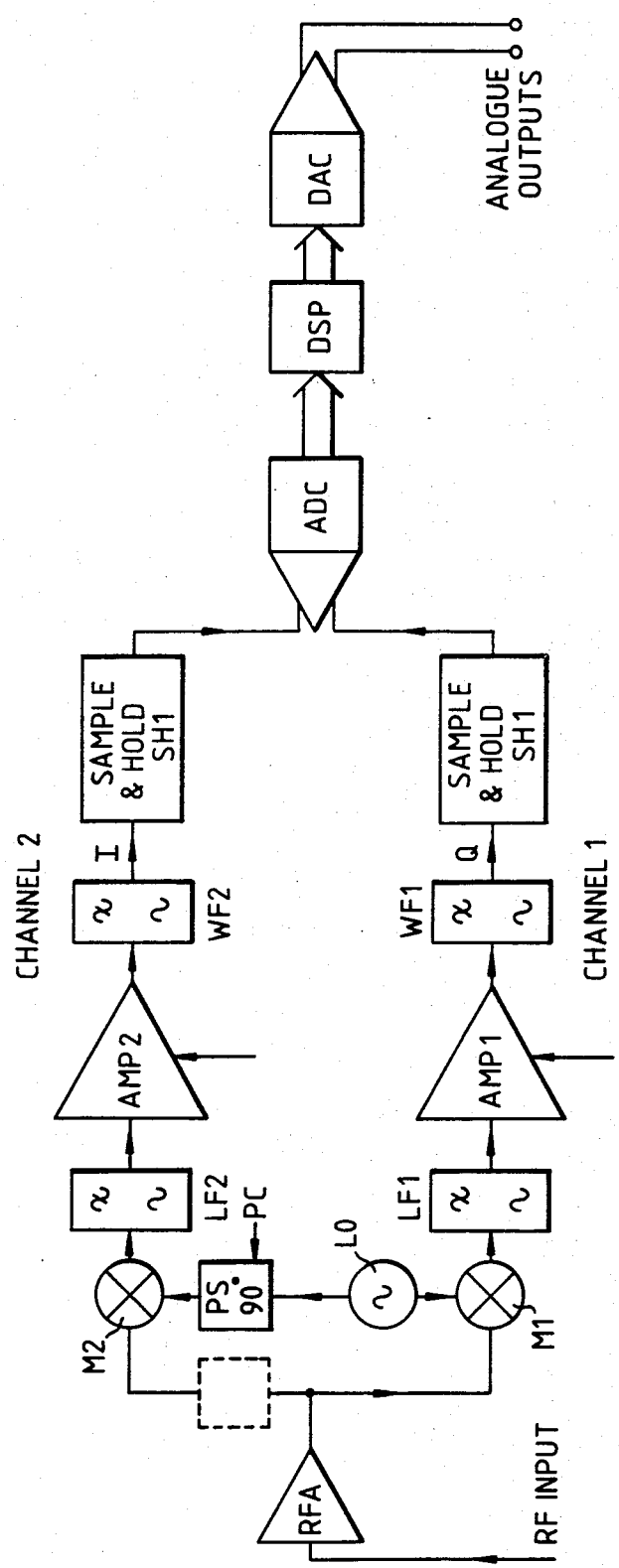
FIG. 1 is a block diagram of the complete receiver.

In FIG. 1, a received radio signal, which may be modulated in the form of am, fm, pm or ssbm is amplified in a radio frequency amplifier RFA and then fed into mixers M1 and M2 in first and second signal paths 1 and 2 respectively. In the mixers M1 and M2, the radio signals are mixed with a local oscillator frequency from oscillator L0. The local oscillator frequency is set to a frequency defined as the main transmission frequency of the radio signals. For fm, am and pm this is the carrier frequency but for ssbm it is the side band centre frequency. In channel 1, the local oscillator frequency is mixed directly with the radio signals but for channel 2, the local oscillator output is phase shifted, preferably through 90° in phase shifter PS, prior to the mixing. Variations either side of 90° tend to cause deterioration in audio quality unless corrected but do provide an operative system. A 90° shift will be assumed for the description and analysis of the system.

As an alternative a relative phase shift prior to mixing can be achieved by a phase shifter PS2 for the radio frequency in path 2.

The mixed outputs incorporate baseband signals defined as I and Q in channels 1 and 2 respectively and these are in quadrature with respect to each other. The quadrature signals are passed through low pass filters LF1 and LF2, amplified in amplifiers AMP1 and AMP2 and again filtered in wideband noise filters WF1 and WF2. Filters WF1 and WF2 may not be necessary in all circumstances.

Each of the signals I and Q is converted from analogue to digital form in a conventional manner by means of sample and hold devices SH1 and SH2 and a subsequent analogue to digital converter ADC which converts each successive held voltage level into a digital form. The digitised I and Q signals are then available for processing in such a manner as to produce the original modulating signal. In FIG. 1, no details of this conversion are shown but the digital signal processor is represented as a single block DSP. In a typical application, as shown, the processed digital signals representing the original modulating signal are converted back to analogue form in a digital to analogue converter DAC which provides an analogue output of the modulating signal. In other applications, it may be preferable to make direct use of the digital output of the digital signal processor without reconversion to analogue form.

The nature of the digital signal processor depends on the nature of modulation of the radio frequency signal with which the receiver is intended to operate. It is possible for the processor to be capable of demodulating only one of fm, am, pm and ssbm but a particular feature of the invention is that simply by providing for a range of digital operations a multi-mode receiver is produced. For this reason it is envisaged that the whole range of signal processing would normally be provided, but a single-mode or two-mode or three-mode receiver could be provided if required.

Figure 2:
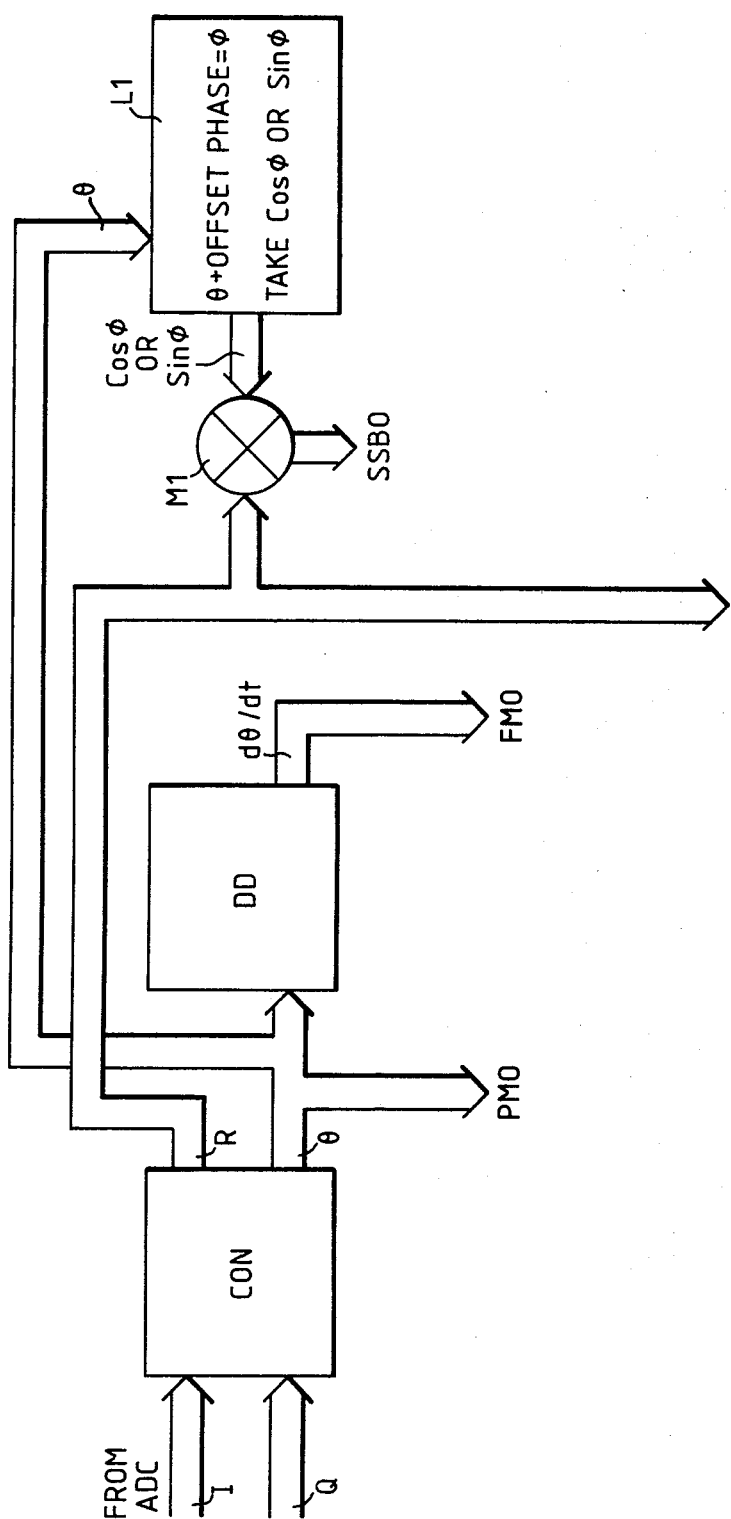
FIG. 2 is a block diagram, showing some detail, of the digital signal processor incorporated in the receiver.

FIG. 2 shows details of the digital signal processor for am, fm, pm and ssbm. The first and common stage CON involves a conversion of digital I and Q signals to R and $\theta$ where R is the amplitude of the basic modulating signal and $\theta$ is its phase angle. This stage will be described in greater detail subsequently with reference to FIG. 3. The $\theta$ signal is a direct digital representation of the modulating signal when the radio signal has been transmitted in phase modulated form and is available at output PMO. The amplitude signal R is a direct digital respresentation of the modulating signal when the radio signal has been transmitted in amplitude modulated form and is available at output AMO. When the $\theta$ signal is differentiated in a digital differentiator DD, the differentiated output, $d\theta/dt$ (t represents time) is a digital representation of the modulating signal when the radio signal is in frequency modulated form and is available at output FMO.

Derivation of the original modulating signal aft ssb modulating requires more digital processing in logic block L1. The relationship between R and $\theta$ and an original ssb modulation signal is that the modulating signal is equal to either R Sin $\phi$ or R Cos $\phi$. $\phi$ is derived by subtracting from $\theta$ (or adding to $\theta$) the phase at the offset frequency, effectively performing a single sideband frequency shift. Subtraction or addition depends on whether the upper or the lower sideband respectively is transmitted. Starting with $\theta$, this has the phase at the offset frequency added or subtracted to derive $\phi$. The Cos $\phi$ or Sin $\phi$ can be derived and the resulting value multiplied by R in a multiplier M1 to derive R Cos $\phi$ or R Sin $\phi$. This value appears at output SSBO and represents the modulating signal when ssbm was employed in the transmitted radio signal. These digital operators are represented schematically in FIG. 2.

When two or more of the outputs PMO, FMO, AMO and SSBO are provided, switching means should also be provided to connect the relevant signal to the digital to analogue converter DAC in FIG. 1, depending on the nature of the modulation of the received radio signal.

Figure 3:
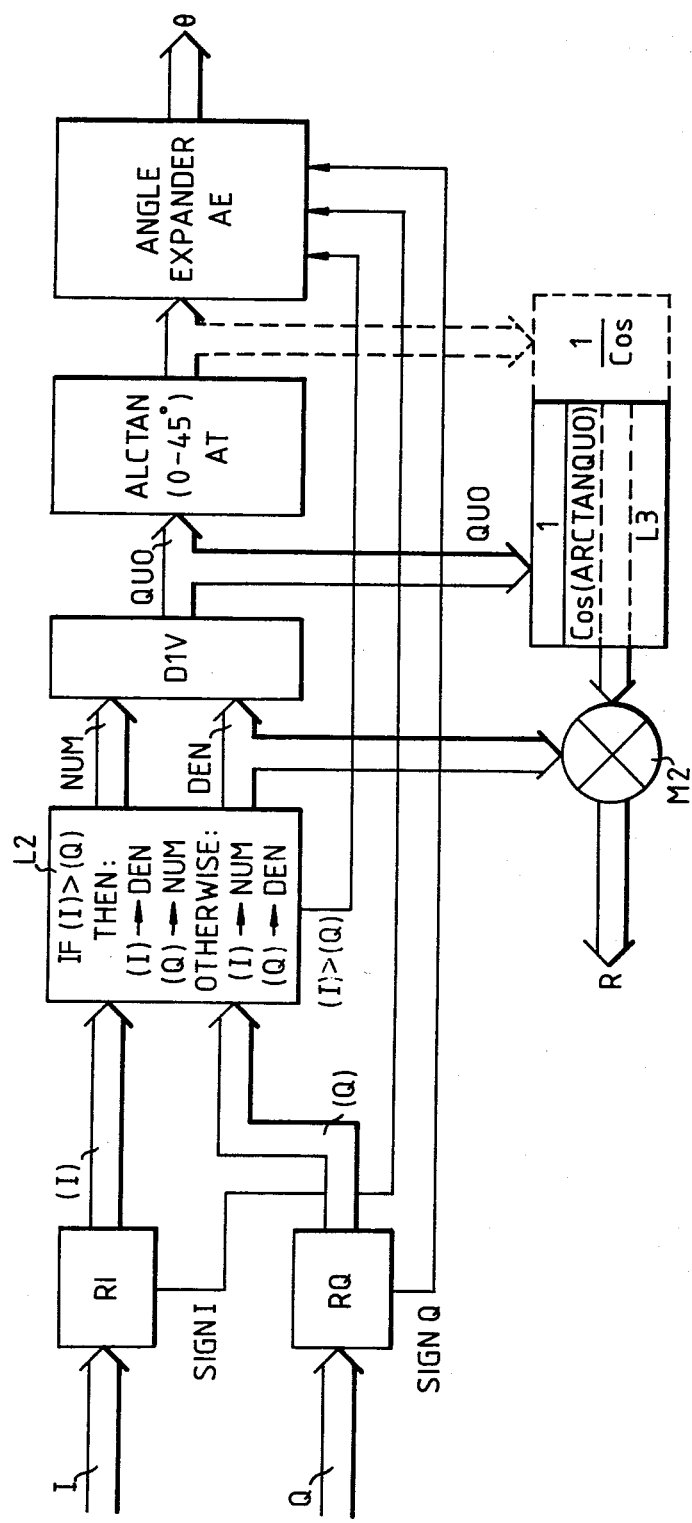
FIG. 3 is a block diagram, showing still further detail of the parts of the digital signal processor for converting quadrature signals into amplitude and phase angle.

FIG. 3 is a block diagram of the conversion stage CON of FIG. 2, showing greater detail. This stage converts the digitised I and Q signals to R and $\theta$ in the following manner. Digitised I and Q can have positive and negative values. Rectifiers RI and RQ convert I and Q into scalar values $|I|$ and $|Q|$ and provide a separate binary output indicating the sign of I and Q.

$|I|$ and $|Q|$ are fed to a logic block L which first compares the values of $|I|$ and $|Q|$ to select the larger of these. The logic block L2 has two outputs NUM and DEN which respectively form the numerator and denominator in a divide block DIV. $|I|$ and $|Q|$ are supplied through the logic block L to the outputs NUM and DEN in a manner dependent on the comparison of $|I|$ and $|Q|$. If $|I|$ is greater than $|Q|$, then $|I|$ is fed to DEN and $|Q|$ to NUM. Otherwise, $|I|$ is connected to NUM and $|Q|$ to DEN. As the numerator cannot be greater than the denominator, Arctan of the quotient QUO is in the range 0° to 45°. The Arctan operation on value QUO is carried out in an Arctan look-up table or by direct calculation in block AT.

An angle expander AE is fed with the value Arctan QUO and three other bits indicative respectively of the sign of I, the sign of Q and whether $|I|$ is greater than $|Q|$. The latter bit is derived in logic book L. This data enables the angle expander to derive a unique value of $\theta$ based on Arctan (I/Q) in a 360° range of for example 0° to 360° or $-180°$ to $+180°$. Thus the output from the angle expander AE is a digitised value of $\theta$.

Mathematically, $R = Q/\cos \theta = I/\sin \theta$. R is always positive (Q and Cos $\theta$ always have the same sign as do I and Sin $\theta$). Thus in deriving R, signs can be ignored.

When the output DEN is $|Q|$, then QUO = $|I/Q|$. As $\theta$ = Arctan (I/Q), Cos $\theta$ is derived by operating on $|I/Q|$, possibly by way of a look-up table or direct calculation, to produce 1/(Cos Arctan $|I/Q|$). This function is performed in logic block L3. A multiplier M2 simply multiplies the output of logic block L2 by DEN to produce $|Q|/(\cos$ Arctan $|I/Q|)$ namely Q/Cos $\theta$ which in turn represents R.

When the output DEN is $|I|$, then QUO = $|Q/I|$. When the $|Q/I|$ value is operated on in the same way as the previously discussed $|I/Q|$, the resulting value is 1/(Cos Arctan $|Q/I|$) which can be shown to be equal to 1/Sin Arctan $|I/Q|$), which is in turn equal to 1/Sin $\theta$. Thus the product of the multiplier is in this situation I/Sin $\theta$, namely R.

Thus, for the whole range of values of Q and I, R is derived from the same logic operations.

As an alternative to operating an QUO to produce 1/Cos Arctan QUO), the output from Arctan block AT can be used and the operation in L3 reduces to deriving 1/Cos $\chi$ where $\chi$ is the previously derived Arctan QUO. This possibility is indicated in dotted lines.

Figure 4:
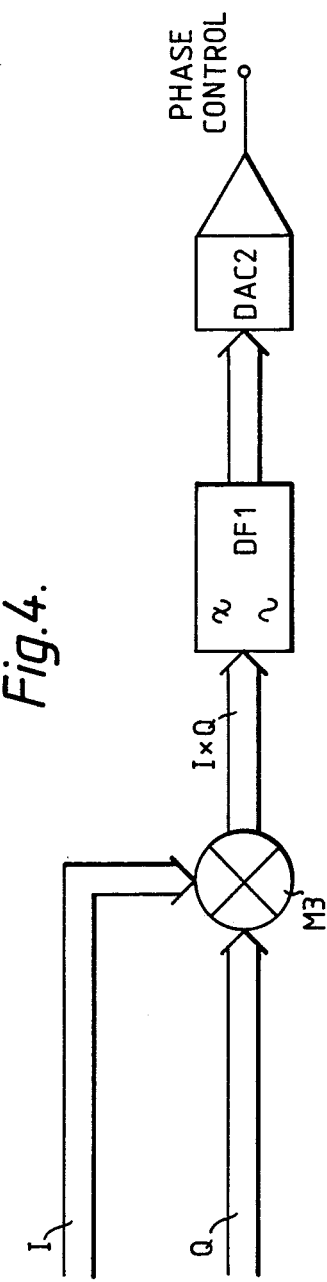

FIG. 4 shows a possible addition to the circuit of FIGS. 1 and 2, which provides for phase control at the phase shifter PS. Phase control or some other form of correction is important for good audio quality. The digitised I and Q signals are multiplied together in multiplier M3. The product IQ is then filtered in a low pass digital filter DF1. The filter output is supplied to a digital to analogue converter DAC 2. The output from DAC 2 has a dc level equivalent to the dc level of IQ which is a convenient indication of phase error, i.e. deviation from 90° phase shifter PS of FIG. 1. This dc level can be applied to phase control input PC in FIG. 1 to correct the phase shift to 90°. The digital filter DF1 is desirable but not essential. Filtering out of higher frequencies derived when multiplying I by Q should not affect the dc level but does simplify the digital to analogue conversion and establishment of the dc level of the output from DAC 2.

Figure 5:
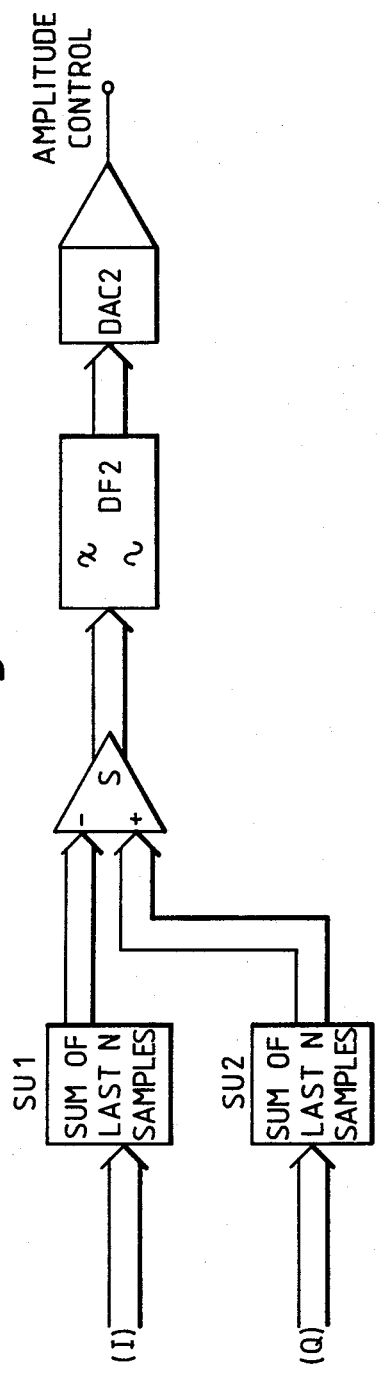

FIG. 5 shows a further possible addition to the circuit of FIGS. 1 and 2, to provide balance between the total gain in channel 1 and the total gains in channel 2. This balance is achieved by gain control at the amplifiers AMP1 and AMP2. Summing units SU1 and SU2 are supplied with |I| and |Q| respectively and each provides an output equal to the sum of the last n samples making up the |I| and the |Q| signals. When the two channel gains are equal the sum of |I| samples should equal the sum of |Q| samples; in other words their difference should be zero. One sum of n samples is subtracted from the other in subtraction unit S. The resulting difference is (optionally) filtered in low pass digital filter DF2, and converted to analogue form in converter DAC3. The dc level of the resulting output is an indication of imbalance in the channels 1 and 2 and is fed to amplifiers AMP1 and AMP2 to correct this gain.

As an alternative, the digital correction signals for phase and gain derived as described with reference to FIGS. 4 and 5 may be used as the basis for a calculation of equivalent digital correction value to be applied in the digital processing unit to the digitised I and Q signals.

FIG. 6 shows an alternative technique for deriving the modulating signal from digitised I and Q when the modulation is fm. Multipliers M4 and M5 are arranged to produce $I^2$ and $Q^2$ respectively and the latter values are added in addition unit A1 to provide $I^2+Q^2$. I and Q are each differentiated in digital differentiators DD2 and DD3. The resulting dQ/dt is multiplied in multiplier M6 with I to provide I dQ/dt. Similarly, the value Q dI/dt is provided from multiplier M7. Outputs from M6 and M7 are subtracted to provide Q dI/dt-I dQ/dt which becomes the numerator for a division unit DIV2. The denominator is $I^2+Q^2$, derived previously. The output from the division unit D2, which appears at FMO2, is then:

$$(Q\ dI/dt - I\ dQ/dt)/(I^2+Q^2)$$

Bearing in mind that $I = R \sin \theta$, $Q = R \cos \theta$ and that both R and $\theta$ are functions of time, the above expression can be reduced to $-d\theta/dt$, that is frequency.

I claim:

1. A radio receiver for receiving and demodulating at least single side band modulated signals wherein the center frequency of the single side band is offset by an offset frequency from the carrier frequency, comprising a first signal path including means for mixing the received signal with a local oscillator frequency running at the main transmission frequency which is the center frequency of the side band for the ssbm signals to obtain a fixed mixed signal and means for filtering said first mixed signal to give a first filtered signal defined as an inphase signal, a second signal path including means for mixing the received RF signal with the local oscillator frequency but with a relative phase shift to obtain a second mixed signal and means for filtering said second mixed signal to provide a second filtered signal defined as a quadrature signal Q, an analogue to digital converter stage to convert the I and Q signals into respective digitised I and Q signals, and a digital signal processor arranged to demodulate the digitised I and Q signals, including means to derive amplitude and phase of the original modulation from the digitised I and Q signals, means to subtract or add phase at the offset frequency to the phase angle $\theta$ to provide a new phase angle $\phi$ and means to derive $R \sin \phi$ or $R \cos \phi$ to produce digitised single side band demodulation signals for upper or lower single side band modulation depending respectively on whether the phase at the offset frequency is subtracted or added.

2. A radio receiver as claimed in claim 1 further comprising a digital to analogue converter to convert the respective demodulated digital signals into analogue signals.

3. A radio receiver as claimed in claim 1 wherein the digital signal processor includes means to provide demodulation of amplitude and/or phase modulation from the respective output of said deriving means.

4. A radio receiver as claimed in claim 1 wherein the digital signal processor has means to differentiate $\theta$ with respect to time t to derive $d\theta/dt$, constituting demodulation of frequency modulation.

5. A radio receiver as claimed in claim 1 incorporating feedback control circuits leading from the digital signal processor and operative for feeding R and/or $\theta$ in their digitised form back to the two signal paths to control respectively amplification within the two signal paths and/or the relative phase shift in the second signal path as compared with the first signal path.

6. A radio receiver as claimed in claim 1 wherein the digital signal processor is provided with means to additionally derive the output of:

(a) $\theta$ for phase modulation
(b) R for amplitude modulation
(c) $d\theta/dt$ for frequency modulation to provide a radio receiver capable of receiving and demodulating at least two of the four specified forms of modulation.

* * * * *